US012802697B2

(12) United States Patent
Alakuijala et al.

(10) Patent No.: US 12,802,697 B2
(45) Date of Patent: Nov. 17, 2026

(54) MAINTAINING INVARIANCE OF SENSORY DISSONANCE AND SOUND LOCALIZATION CUES IN AUDIO CODECS USING AN ACOUSTIC PERCEPTION ALGORITHM MODELED ON COCHLEAR

(71) Applicant: GOOGLE LLC, Mountain View, CA (US)

(72) Inventors: Jyrki Antero Alakuijala, Wollerau (CH); Martin Bruse, Tyreso (SE)

(73) Assignee: GOOGLE LLC, Mountain View, CA (US)

( * ) Notice: Subject to any disclaimer, the term of this patent is extended or adjusted under 35 U.S.C. 154(b) by 730 days.

(21) Appl. No.: 18/000,443

(22) PCT Filed: Aug. 28, 2020

(86) PCT No.: PCT/US2020/070477
§ 371 (c)(1),
(2) Date: Dec. 1, 2022

(87) PCT Pub. No.: WO2022/046155
PCT Pub. Date: Mar. 3, 2022

(65) Prior Publication Data
US 2023/0230605 A1 Jul. 20, 2023

(51) Int. Cl.
*G10L 19/02* (2013.01)
*G10L 15/20* (2006.01)
(Continued)

(52) U.S. Cl.
CPC ............ *G10L 19/032* (2013.01); *G10L 15/20* (2013.01); *G10L 19/008* (2013.01);
(Continued)

(58) Field of Classification Search
CPC ... G10L 19/032; G10L 19/002; G10L 19/008; G10L 19/035; G10L 19/0017;
(Continued)

(56) References Cited

U.S. PATENT DOCUMENTS 5,884,269 A 3/1999 Cellier et al.
6,122,619 A 9/2000 Kolluru et al.
(Continued)

FOREIGN PATENT DOCUMENTS

CN 1677493 A 10/2005
CN 101436406 A 5/2009
(Continued)

OTHER PUBLICATIONS

International Search Report and Written Opinion for PCT Application No. PCT/US2020/070477, mailed on Apr. 26, 2021, 11 pages.
(Continued)

*Primary Examiner* — Farzad Kazeminezhad
(74) *Attorney, Agent, or Firm* — BRAKE HUGHES BELLERMANN LLP

(57) ABSTRACT

A method including receiving a plurality of audio channels based on an audio stream, applying a model based on at least one acoustic perception algorithm to the plurality of audio channels to generate a first modelled audio stream, quantizing the plurality of audio channels using a first set of quantization parameters, dequantizing the quantized plurality of audio channels using the first set of quantization parameters, applying the model based on at least one acoustic perception algorithm to the dequantized plurality of audio channels to generate a second modelled audio stream, comparing the first modelled audio stream and the second modelled audio stream, in response to determining the comparison of the first modelled audio stream and the second modelled audio stream does not meet a criterion,
(Continued)

generating a second set of quantization parameters, and quantizing the plurality of audio channels using the second set of quantization parameters.

18 Claims, 8 Drawing Sheets

(51) Int. Cl.

| | |
|---|---|
| ***G10L 19/00*** | (2013.01) |
| ***G10L 19/008*** | (2013.01) |
| ***G10L 19/032*** | (2013.01) |
| ***H03M 13/00*** | (2006.01) |
| ***H04M 1/00*** | (2006.01) |
| ***H04M 13/00*** | (2006.01) |
| ***H04N 19/124*** | (2014.01) |

(52) U.S. Cl.
CPC ..... *H03M 13/6312* (2013.01); *G10L 19/0017* (2013.01); *G10L 19/0208* (2013.01); *H04M 1/00* (2013.01); *H04N 19/124* (2014.11)

(58) Field of Classification Search
CPC . G10L 19/0208; H03M 13/6312; H04M 1/00; H04N 19/124
USPC .......... 704/E19.016, E15.039, 201, E19.019; 375/240.03
See application file for complete search history.

(56) References Cited

U.S. PATENT DOCUMENTS

| | | | | |
|---|---|---|---|---|
| 9,728,196 | B2 | 8/2017 | Oh et al. | |
| 9,911,434 | B2 | 3/2018 | Purnhagen et al. | |
| 9,980,074 | B2 | 5/2018 | Sen et al. | |
| 10,580,424 | B2 | 3/2020 | Mirzahasanloo | |
| 2003/0046064 | A1* | 3/2003 | Moriya | G10L 19/0017 704/201 |
| 2003/0115041 | A1 | 6/2003 | Chen et al. | |
| 2003/0115042 | A1 | 6/2003 | Chen et al. | |
| 2004/0162720 | A1* | 8/2004 | Jang | G10L 19/035 704/E19.016 |
| 2006/0004565 | A1* | 1/2006 | Eguchi | G10L 19/0208 704/E19.019 |
| 2007/0033027 | A1* | 2/2007 | Yao | G10L 15/20 704/E15.039 |
| 2011/0002266 | A1 | 1/2011 | Gao | |
| 2014/0269901 | A1* | 9/2014 | Shi | H04N 19/124 375/240.03 |
| 2017/0077964 | A1* | 3/2017 | Guilford | H03M 13/6312 |
| 2019/0164052 | A1 | 5/2019 | Sung et al. | |
| 2020/0027467 | A1 | 1/2020 | Clark | |
| 2020/0082841 | A1 | 3/2020 | Disch et al. | |
| 2020/0176004 | A1 | 6/2020 | Kleijn et al. | |
| 2023/0352032 | A1 | 11/2023 | Disch et al. | |

FOREIGN PATENT DOCUMENTS

| | | | | |
|---|---|---|---|---|
| CN | 102150202 A | | 8/2011 | |
| CN | 102436819 A | | 5/2012 | |
| CN | 103039023 | * | 4/2013 | H04B 15/00 |
| CN | 105074821 A | | 11/2015 | |
| CN | 105453175 A | | 3/2016 | |
| CN | 105580072 A | | 5/2016 | |
| JP | 20210109609 | * | 5/2010 | H04M 1/00 |
| JP | WO20110838849 | * | 5/2013 | G10L 19/002 |
| TW | 202111692 | * | 3/2021 | G10L 19/008 |
| WO | 03049014 A1 | | 6/2003 | |

OTHER PUBLICATIONS

Zhen, et al., "Cascaded Cross-Module Residual Learning Towards Lightweight End-to-End Speech Coding", arXiv.org, Cornell University Library, Jun. 18, 2019, 5 pages.

Feng, et al., "Research on Digital Audio Compression Technology", China Media Technology, , May 15, 2008, 5 pages; English Abstract provided.

Sheng, et al., "A study on dynamic adjustment of the non-uniform quantizer in advanced audio coding", Journal of Nanjing University (Natural Science Edition), vol. 45, No. 1, Jan. 2009, 9 pages; English Abstract provided.

Yu, et al., "MP3 dual compression detection method based on the same compression rate", Computer Engineering and Applications, 49(12), English Abstract provided, Jun. 15, 2013, 4 page; English Abstract provideds.

Herre, et al., "Psychoacoustic Models for Perceptual Audio Coding—A Tutorial Review", Applied Sciences, MDPI, Jul. 17, 2019, doi: 10.3390/app9142854, 22 pages.

"Method for Objective Measurments of Perceived Audio Quality", ITU-R Recommendation BS.1387, (https://www.itu.int/rec/R-RECBS), 1998, 89 pages.

* cited by examiner

MAINTAINING INVARIANCE OF SENSORY DISSONANCE AND SOUND LOCALIZATION CUES IN AUDIO CODECS USING AN ACOUSTIC PERCEPTION ALGORITHM MODELED ON COCHLEAR

CROSS REFERENCE TO RELATED APPLICATION

This application is a 35 U.S.C. § 371 National Phase Entry Application from PCT/US2020/070477, filed Aug. 28, 2020, designating the U.S., the disclosure of which is incorporated herein by reference in its entirety.

FIELD

Embodiments relate to encoding audio streams.

BACKGROUND

Audio encoders (e.g., MP3 encoders, opus encoders) typically have two goals for quantization. The first goal is to match the signal (e.g., by selecting the time window and other quantization decisions) and the second goal is to respect hearing thresholds (e.g., with both frequency and temporal masking).

Quantization includes the use of an integral transform such as windowed DCT, producing real-valued coefficients. The coefficients are stored in integer form. The integerization of the coefficients produces an error that is sometimes called the quantization error. The amount of quantization is maximized for maximal compression savings.

SUMMARY

In a general aspect, a device, a system, a non-transitory computer-readable medium (having stored thereon computer executable program code which can be executed on a computer system), and/or a method can perform a process with a method including receiving a plurality of audio channels based on an audio stream, applying a model based on at least one acoustic perception algorithm to the plurality of audio channels to generate a first modelled audio stream, quantizing the plurality of audio channels using a first set of quantization parameters, dequantizing the quantized plurality of audio channels using the first set of quantization parameters, applying the model based on at least one acoustic perception algorithm to the dequantized plurality of audio channels to generate a second modelled audio stream, comparing the first modelled audio stream and the second modelled audio stream, in response to determining the comparison of the first modelled audio stream and the second modelled audio stream does not meet a criterion, generating a second set of quantization parameters, and quantizing the plurality of audio channels using the second set of quantization parameters.

In another general aspect, a device, a system, a non-transitory computer-readable medium (having stored thereon computer executable program code which can be executed on a computer system), and/or a method can perform a process with a method including receiving an audio stream, applying a model based on at least one acoustic perception algorithm to the audio stream to generate a first modelled audio stream, compressing the audio stream using a first set of quantization parameters, decompressing the compressed the audio stream using the first set of quantization parameters, applying the model based on at least one acoustic perception algorithm to the decompressed audio stream to generate a second modelled audio stream, comparing the first modelled audio stream and the second modelled audio stream, in response to determining the comparison of the first modelled audio stream and the second modelled audio stream does not meet a criterion, generating a second set of quantization parameters, and compressing the audio stream using the second set of quantization parameters.

Implementations can include one or more of the following features. For example, the model based on at least one acoustic perception algorithm can be a dissonance model. The model based on at least one acoustic perception algorithm can be a localization model. The model based on at least one acoustic perception algorithm can be a salience model. The model based on at least one acoustic perception algorithm can be a trained machine learning model trained using at least one of a supervised learning algorithm and an unsupervised learning algorithm. The model based on at least one acoustic perception algorithm can be based on a frequency and a level algorithm applied to the audio channels in the frequency domain. The model based on at least one acoustic perception algorithm can be based on a calculation of a masking level between at least two frequency components. The model based on at least one acoustic perception algorithm can be based on at least one of a time delta comparison, a level delta comparison and a transfer function applied to transients associated with a left audio channel and a right audio channel. The model based on at least one acoustic perception algorithm can be based on a frequency, a level, and a cochlear place algorithm applied to the audio channels in the frequency domain.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of the example embodiments and wherein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Often, the amount of quantization is maximized for maximal compression savings. However, quantization (e.g., a lossy compression process) tends to flatten the dynamics of the audio. In other words, quantization can reduce the differences in pitch and volume or reduce dissonance and cause the audio stream to sound more consonant. This can reduce the artistic expression in a piece of music or make sounds seem artificial or plastic. Quantization tends to also reduce sound localization cues, making sound sources blurrier and less differentiated from each other. This may make it more difficult to focus (e.g., on the guitarist of the band) because the sounds seem fused together. For example, guitar screech, squeal or other feedback (e.g., from fingers moving across the strings and/or fretboard) can be unintentionally reduced or removed due to quantization.

Example implementations choose quantization parameters in a way that quantization's qualitative impact on listening can be minimized. For example, implementations can include reducing quantization by dissonance modeling, sound localization modeling, and salience modeling, which all (alone or together) can reduce the impact of quantization on the listening experience (e.g., artistic expression, source differentiation, and/or the like). The impact of quantization can be minimized by modeling the variable efficiency and resolution of human hearing at different frequencies and in different masking conditions and adjusting, choosing, revising and/or the like quantization parameters (e.g., to reduce compression) based on the aforementioned modeling.

Figure 1:
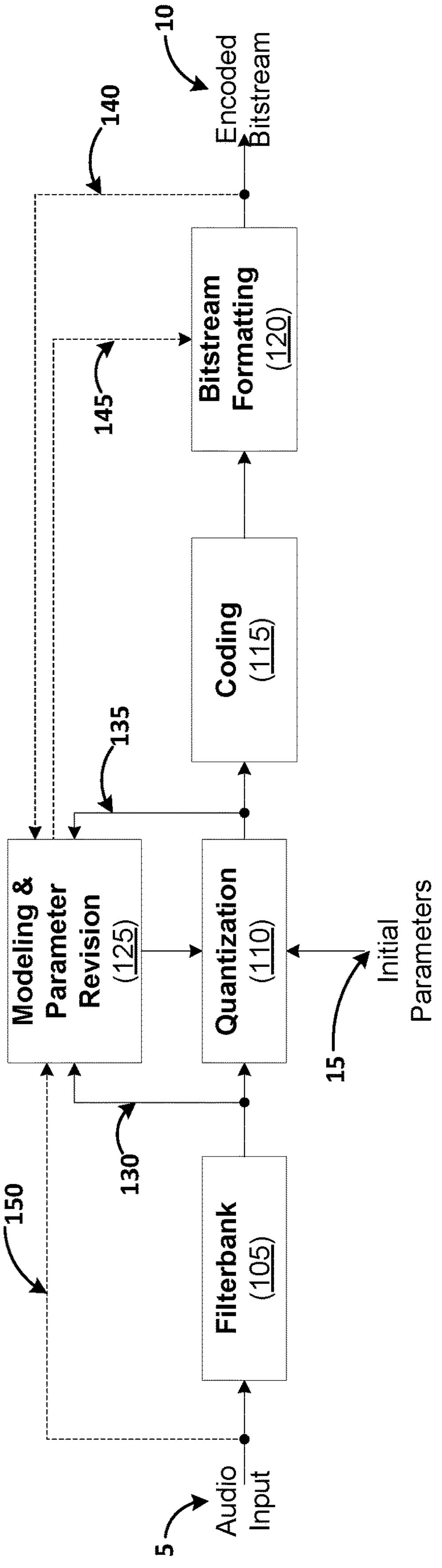
FIG. 1 illustrates a block diagram of an audio encoder according to at least one example embodiment.

FIG. 1 illustrates a block diagram of an audio encoder according to at least one example embodiment. As shown in FIG. 1, the audio encoder includes, at least, a filter bank 105 block, a quantization 110 block, a coding 115 block, a bitstream formatting 120 block, and a modeling and parameter revision 125 block.

The filter bank 105 can be configured to divide the audio stream or signal (e.g., audio input 5) into frequency sub-bands (e.g., equal-width frequency sub-bands). The frequency sub-bands can be within a range that is audible to humans. Therefore, the frequency sub-bands can be based on the audio resolution of the human ear. The frequency sub-bands can be transformed (or digitized) using a discrete cosine transform (DCT). In some implementations, the frequency sub-bands can be referred to as channels. In some implementations, channels can refer to an instrument (e.g., guitar, horn, microphone, drum, and/or the like). In some implementations, channels can refer to left and/or right channel (e.g., left/right for a pair of headphones).

The quantization 110 can be configured to reduce the number of bits needed to store a numeric value (e.g., integer, floating point value, and/or the like) by reducing the precision of the number. Bit allocation can use information from an acoustic allocation model (e.g., a masking model, a psychoacoustic model, and/or the like) to determine the number of bits or code bits to allocate to each channel. Bit allocation can be based on the following formula:

$$MNR_{dB}=SNR_{dB}-SMR_{dB} \tag{1}$$

Where:

$MNR_{dB}$ is the mask-to-noise ratio, $SNR_{dB}$ is the signal-to-noise ratio, and $SMR_{dB}$ is the signal-to-mask ratio.

$SNR_{dB}$ is based on the compression standard, and $SMR_{dB}$ is based on the acoustic allocation model. The channels can be ordered by lowest to highest mask-to-noise ratio, and the lowest channel can be allocated the smallest number of code bits. The ordering and allocation process can be repeated (e.g., in a loop) until all (or approximately all) bits are allocated. In some implementations, equation 1 is used to determine an initial bit allocation (e.g., using initial parameters 15).

The coding 115 can be configured to code the quantized values. For example, a Huffman algorithm can be used to code the quantized values. Quantization can be a lossy process in the compression process, and coding can be a lossless process in the compression process.

The bitstream formatting 120 can be configured to format the compressed coded audio bit stream based on a standard (e.g., MP3, AAC, Opus, Vorbis, and/or the like) to generate encoded bitstream 10. The standard can have a file structure including a header, the compressed coded audio bit stream, and metadata associated with the compressed coded audio bit stream. The header can include information related to communicating, storing, compression/decompression, bitrate, error protection and/or the like. Metadata (sometimes called a tag) can include any information (e.g., title, artist, copyright, studio, licensing). However, standards often do not limit the content of the metadata for any reason.

The modeling and parameter revision 125 can be configured to model the incoming (before compression) audio channels and the compressed audio channels. The model can be based on at least one acoustic perception algorithm (e.g., dissonance, localization, salience, and/or the like). The modeling and parameter revision 125 can be configured to compare the results of the modelling. In response to determining the models have differences that do not meet a criterion (e.g., a threshold value, a threshold value per channel, and/or the like), the modeling and parameter revision 125 can be configured to revise (or cause the revision of) the parameters associated with quantizing the audio stream.

In an example implementation, the modeling and parameter revision 125 can be configured to compare models generated based on the input to quantization 110 (130) and the output of quantization 110 (135) (illustrated using solid lines). This comparison can use a time window to select portions of the audio stream to compare. As the modeling and parameter revision 125 compares the audio stream before and after quantization 110, the modeling and parameter revision 125 can cause the parameters associated with quantizing the audio stream to be revised or changed. For example, the modeling and parameter revision 125 can cause the revision of the parameters associated with quantizing the audio stream, such that the audio stream is compressed less (e.g., has more bits after compression), as compared with a compression that would result from un-revised parameters. Quantizing the audio stream such that the audio stream is compressed less compared with a compression that would result from un-revised parameters can result in the audio stream including more details to retain artistic expression (e.g., dynamics, sound localization cues, and/or the like).

In an alternative (or additional) example implementation, the modeling and parameter revision 125 can be configured to compare models generated based on the input audio stream 5 (150) and the compressed coded audio bit stream 140 (illustrated using dashed lines). This comparison can use a complete audio bitstream, a substantial portion of the audio bitstream, some other portion of the bitstream, and/or the like. The modeled input bit stream 145 can be communicated to the bitstream formatting 120 and added to the formatted file as metadata. In response to a trigger (e.g., compression complete), the modeling and parameter revision 125 can model the compressed coded audio bit stream 140 and compare the result to the modeled input bit stream 145.

In response to determining the models have differences that do not meet a criterion (e.g., a threshold value, a threshold value per channel, and/or the like), the modeling and parameter revision 125 can be configured to revise (or cause the revision of) the parameters associated with quantizing the audio stream and cause the encoder to compress the audio input 5 with the revised parameters. For example, the modeling and parameter revision 125 can cause the revision of the parameters associated with quantizing the audio stream such that the audio stream is compressed less (e.g., has more bits after compression as compared with a compression that would result from un-revised parameters. Quantizing the audio stream such that the audio stream is compressed less compared with a compression that would result from un-revised parameters can result in the audio stream including more details to retain artistic expression (e.g., dynamics, sound localization cues, and/or the like).

In at least one example implementation, the modeling and parameter revision 125 can have a plurality of models for use in modeling and comparing audio streams. For example, the modeling and parameter revision 125 can include a dissonance model, a localization model, a salience model, an/or the like. The modeling and parameter revision 125 can be configured to use at least one of the models to determine if the parameters associated with quantizing the audio stream should be revised and/or to recompress the audio input 5. In other words, the dissonance model, the localization model, or the salience model can be used alone or in combination. For example, the dissonance model can be used together with the localization model, or the salience model, or the localization model can be used with the salience model, and/or the dissonance model, the localization model, and the salience model can be used together. The decision process can use a weighted algorithm. For example, the result of the dissonance model can be weighted more heavily than the result of the localization model and/or the salience model.

Figure 2:
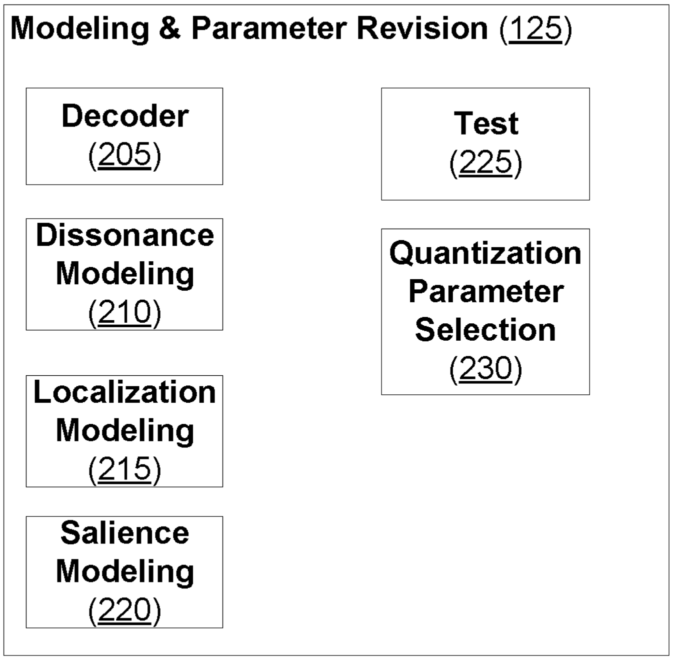
FIG. 2 illustrates a block diagram of a component of the audio encoder according to at least one example embodiment.

FIG. 2 illustrates a block diagram of a component of the audio encoder according to at least one example embodiment. As shown in FIG. 2, the modeling and parameter revision 125 block includes a decoder 205 block, a dissonance modeling 210 block, a localization modeling 215 block, a salience modeling 220 block, a test 225 block, and a quantization parameter selection 230 block.

The decoder 205 can be configured to decompress and/or partially decompress an audio stream. The decoder 205 can be configured to decompress and/or partially decompress the audio stream to generate decompressed audio channels. The decompressed audio channels may or may not be transformed to the time domain and combined (the opposite of filtering) to generate an analog audio stream.

For example, the decoder 205 can receive a quantized audio stream 135. The decoder 205 can dequantize the quantized audio stream 135 using the same (except to the opposite effect) algorithm (e.g., based on equation 1) as was used to quantize the quantized audio stream 135. The decoder 205 can be further configured to perform inverse processes that may have been performed together with the quantization (e.g., coding 115). For example, the decoder 205 can be configured to decode (e.g., inverse of coding 115) the quantized audio stream 135 prior to dequantizing the quantized audio stream 135.

Alternatively, and/or in addition to, the decoder 205 can receive a compressed coded audio bit stream 140. The decoder 205 can read the compressed audio stream from the compressed coded audio bit stream 140. The decoder 205 can be further configured to decode (e.g., inverse of coding 115) the compressed audio stream and dequantize the decoded audio stream to generate decompressed audio channels.

The dissonance modeling 210 can be configured to model the dissonance in an audio stream (e.g., model the audio channels). Dissonance can be the impression of tension or clash experienced by a listener when certain combinations of tones or notes are sounded together. Dissonance can be the opposite of consonance. Consonance can be the impression of stability and repose experienced by a listener when certain combinations of tones or notes are sounded together. Some music styles include intentionally changing (e.g., harmonious intervals) between dissonance and consonance.

Therefore, modeling dissonance should include an indication of an amount of the tension. Tension can relate to tone which corresponds to acoustic level (e.g., power in db) and frequency (e.g., channel). Therefore, modeling dissonance can include the use of at least one algorithm based on at least one of acoustic level and frequency (e.g., the acoustic power for each channel) applied to the audio stream.

The localization modeling 215 can be configured to determine the location of a sound source. Localization can relative to sound heard by each of the human ears. For example, the location of a sound source can be relative to the sound would be heard by the left ear, the right ear, or a combination of the right ear and the left ear (e.g., a source that is in front of or behind the listener). Localization can be determined based on a localization vector. The localization vector can be based on, at least, a comparison of transfer functions between sources in left and/or right channels (e.g., left/right for a pair of headphones) of an audio stream, a comparison of level data between sources in in the left and/or right channels of the audio stream, and a comparison of a time delta between source onset delays of different channels of the audio stream. References to channel with regard to channel can also include left channel and right channel (e.g., left/right for a pair of headphones). For example, a source (e.g., an instrument) can be associated with a channel as well as a left and/or right channel.

The salience modeling 220 can be configured to determine the audio salience in the audio stream. Audio salience can be used to predict the perceptibility, or salience (noticeability, importance or prominence) of the differences in dissonance or localization cues. Audio salience can be based on a partial loudness of components of the audio stream. Partial loudness can refer to the actual perceived loudness of a sound at a cochlear place against a background of other sounds. The partial loudness can be determined based on a masking of frequency components in the audio stream. The masking can be based on level, frequency and cochlear place. A cochlear place can be a correlation between a stimulus location on the cochlear (human inner ear) and a frequency, a frequency range, a combination of frequencies, and/or the like.

The test 225 can be configured to test the results of applying a model to an original audio stream and the audio stream after the audio stream has been compressed and decompressed. Testing the results can include comparing a delta between the original audio stream and the audio stream after the audio stream has been compressed and decompressed. The delta can be compared to a criterion (e.g., a threshold value). For example, a dissonance, a localization and/or a salience of the original audio stream can be compared to a dissonance, a localization and/or a salience of the audio stream after the audio stream has been compressed and decompressed. In response to determining the delta does not pass the criterion, a generation or selection of an updated quantization parameter(s) can be triggered, and the audio file can be recompressed.

In an alternate implementation, the test 225 can be configured to test the results of applying a model to an original audio stream and the audio stream after the audio stream has been quantized and dequantized. Testing the results can include comparing a delta between the original audio stream and the audio stream after the audio stream has been quantized and dequantized. The delta can be compared to a criterion (e.g., a threshold value). For example, a dissonance, a localization, and/or a salience of the original audio stream can be compared to a dissonance, a localization and/or a salience of the audio stream after the audio stream has been quantized and dequantized. In response to determining the delta does not pass the criterion, a generation or selection of an updated quantization parameter(s) can be triggered, and the audio file can be re-quantized.

The quantization parameter selection 230 can be configured to cause the revision of the parameters associated with quantizing the audio stream such that the audio stream is compressed less (e.g., has more bits after compression). Quantizing the audio stream such that the audio stream is compressed less can result in the audio stream including more details to retain artistic expression (e.g., dynamics, sound localization cues, and/or the like). Quantization parameters can include scale factors, scale factor bands, step size, subdivision into regions, quantization noise, masking threshold, allowed distortion, bits available for coding, entropy, and/or the like. Quantization parameter selection can include selecting a combination of quantization parameters and their variables and/or changing one or more of the parameter variables of a previously generated or selected combination of quantization parameters and their variables.

FIGS. 3A-5C illustrate block diagrams of methods according to example implementations. The steps described with regard to FIGS. 3A-5C may be performed due to the execution of software code stored in a memory (e.g., at least one memory 610) associated with an apparatus (e.g., as shown in FIG. 6) and executed by at least one processor (e.g., at least one processor 605) associated with the apparatus. However, alternative embodiments are contemplated such as a system embodied as a special purpose processor. Although the steps described below are described as being executed by a processor, the steps are not necessarily executed by the same processor. In other words, at least one processor may execute the steps described below with regard to FIGS. 3A-5C.

Figure 3A:
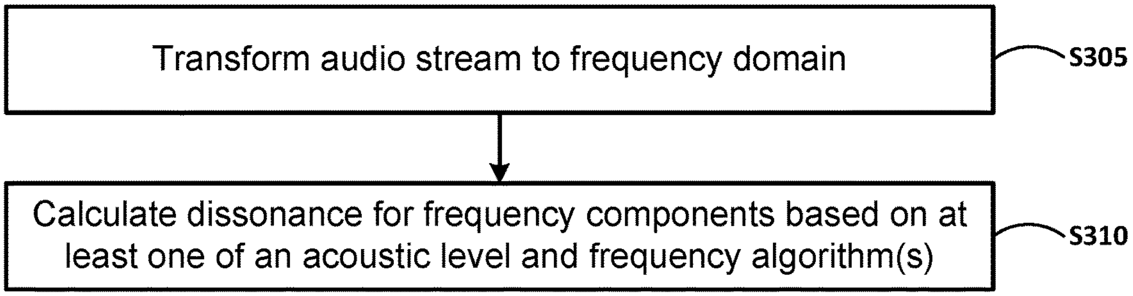
FIG. 3A illustrates a block diagram of a method of determining audio dissonance according to at least one example embodiment.

FIG. 3A illustrates a block diagram of a method of determining audio dissonance according to at least one example embodiment. As shown in FIG. 3A, in step S305 an audio sample is transformed to the frequency domain. For example, an audio stream (e.g., audio input 5), or a portion thereof, can be transformed to the frequency domain. The transform can be a digital Fourier transform (DFT), a fast Fourier transform (FFT), a discrete cosine transform (DCT), adaptive DCT (ADCT), and/or the like.

In step S310 a dissonance for frequency components is calculated based on a level and frequency algorithm(s). For example, the frequency domain audio stream can be separated (e.g., filtered) into a plurality of frequency bands sometimes called frequency components or channels. A level can be a sound intensity level, a sound power level, a sound pressure level, and/or the like. A level frequency algorithm can be configured to compare levels at different frequencies and/or combinations of frequencies. For example, higher frequency levels (or tones) that do not correspond with a lower frequency level (or tone) can indicate dissonance. For example, non-integer frequency ratios can indicate dissonance. This is sometimes called harmonic entropy where dissonance can have harmonic intervals of, for example, 2:3, 3:4, 4:5, 5:7 and/or the like.

In example implementations, dissonance can be frequency based. For example, certain frequencies can have a larger effect on dissonance as compared to other frequencies. Further, combinations of frequencies can have a larger effect on dissonance as compared to other combinations of frequencies. Ranges (e.g., low, mid, high) of frequency can have a larger effect on dissonance as compared to other ranges of frequency. Combinations of frequency and level (e.g., intensity, power, pressure and/or the like) can have a larger effect on dissonance as compared to other combinations of frequency and level. As discussed above, dissonance can be the impression of tension or clash experienced by a listener when certain combinations of tones or notes are sounded together. Therefore, dissonance can be a subjective measurement. Accordingly, whether or not a frequency (e.g., in a human hearing range), level, and/or level type has more or less effect on dissonance can be subjective.

In an example implementation, the level and frequency algorithm can select high (e.g., a threshold value) level (e.g., intensity, power, pressure and/or the like) frequency components and determine a number of dissonant (e.g., non-integer ratio center frequencies) frequency components. In response to determining a high power, harmonics of the corresponding frequency can be determined. If the harmonics include a relatively large (e.g., threshold value) number of non-integer frequency ratios, the audio stream can be a dissonant audio stream. In some implementations, a number of non-integer frequency ratios can be assigned ranges. For example, 1-5 non-integer frequency ratios can be assigned a value of one (1), 6-10 non-integer frequency ratios can be assigned a value of two (2), and so forth. The larger the assigned value, the more dissonant the audio stream may be.

Figure 3B:
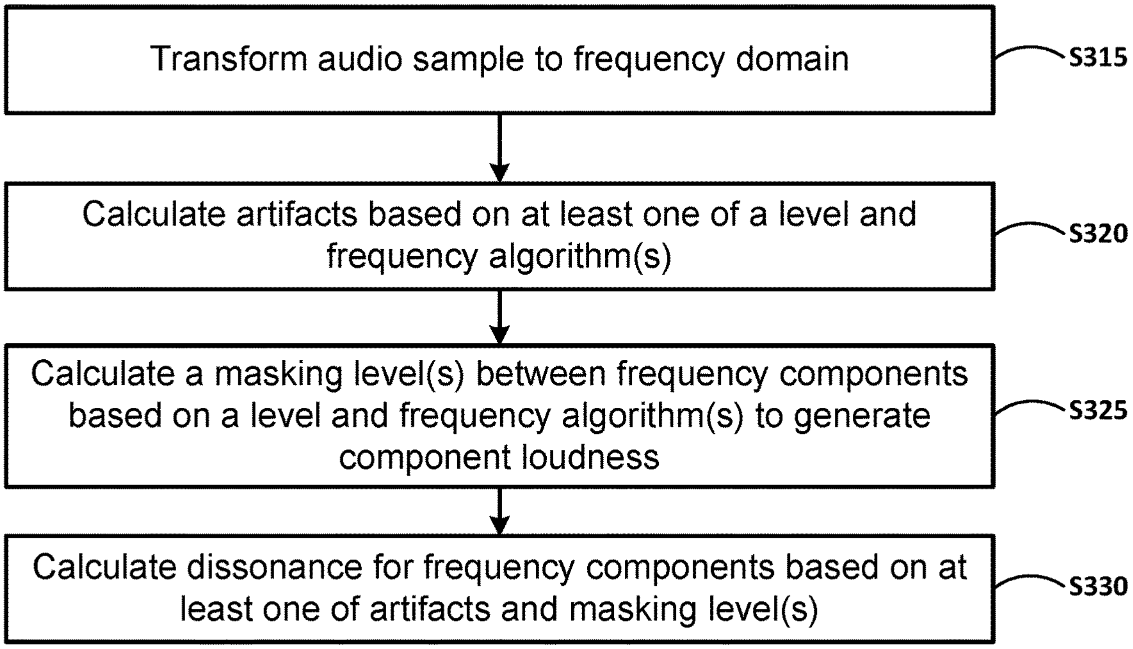
FIG. 3B illustrates a block diagram of another method of determining audio dissonance according to at least one example embodiment.

FIG. 3B illustrates a block diagram of another method of determining audio dissonance according to at least one example embodiment. As shown in FIG. 3B, in step S315 an audio sample is transformed to the frequency domain. For example, an audio stream (e.g., audio input 5), or a portion thereof, can be transformed to the frequency domain. The transform can be a digital Fourier transform (DFT), a fast Fourier transform (FFT), a discrete cosine transform (DCT), adaptive DCT (ADCT), and/or the like.

In step S320 artifacts are calculated based on a level and frequency algorithm(s). For example, the frequency domain audio stream can be separated (e.g., filtered) into a plurality of frequency bands sometimes called frequency components or channels. A level can be a sound intensity level, a sound power level, a sound pressure level, and/or the like. A level frequency algorithm can be configured to compare levels at different frequencies and/or combinations of frequencies. An artifact can be an undesired or unintended effect in the frequency domain data (e.g., corresponding to sound distortions in the time domain) corresponding to the audio stream. An artifact can be when two tones or harmonics partially or substantially overlap. In the frequency domain artifacts can present as secondary signals having a level (e.g., intensity, power, pressure) that is substantial compared to a level of the primary signal (e.g., center frequency). In some implementation an artifact can be associated with two signals in the same frequency band, component or channel. In some implementations an artifact can be associated with two signals in a different frequency band, component or channel.

In step S325 a masking level(s) between frequency components is calculated based on a level and frequency algorithm(s) to generate component loudness. For example, in audio signals, masking can be where a first sound (e.g., from a first instrument) is affected by a second sound (e.g., from a second instrument). Therefore, a masking level between frequency components can be a signal of a sub frequency in a frequency band affecting (e.g., distorting) a signal of the primary frequency in the same frequency band. In addition, a masking level between frequency components can be a signal of a first frequency in a first frequency band affecting (e.g., distorting) a signal of a second frequency in a second frequency band. Therefore, calculating masking level(s) between frequency components can include calculating a level (e.g., intensity, power, pressure) at a primary frequency that cancels the primary signal so that the signal at the sub-frequency or the second frequency can be can isolated because the signal at the sub-frequency or the second frequency can correspond to the artifact.

In step S330 a dissonance for frequency components is calculated based on artifacts and masking level(s). For example, if a number of sub-frequency or second frequency signals is a relatively large (e.g., threshold value) number and/or a delta in level between the masking level and the sub-frequency or second frequency signal level is relatively large (e.g., threshold value), the audio stream can be a dissonant audio stream. In some implementations, a number of sub-frequency or second frequency signals and/or level deltas above a threshold can be assigned ranges. For example, 1-5 sub-frequency or second frequency signals and/or level deltas above a threshold can be assigned a value of one (1), 6-10 sub-frequency or second frequency signals and/or level deltas above a threshold can be assigned a value of two (2), and so forth. The larger the assigned value, the more dissonant the audio stream may be.

Machine learning can include learning to perform a task using feedback generated from the information gathered during computer performance of the task. Machine learning can be classed as supervised and unsupervised. Supervised machine learning can include computer-based learning one or more rules or functions to map between example inputs and desired outputs as established by a user. Unsupervised learning can include determining a structure for input data, for example when optimizing quantization for audio stream reconstruction results and can use unlabeled data sets. Unsupervised machine learning can be used to solve problems where the data can include an unknown data structure (e.g., when a structure of the dissonance data may be variable). The machine learning algorithm can analyze training data and produce a function or model that can be used with unseen data sets (e.g., dissonance data) to produce desired output values or signals (e.g., quantization parameters).

Figure 3C:
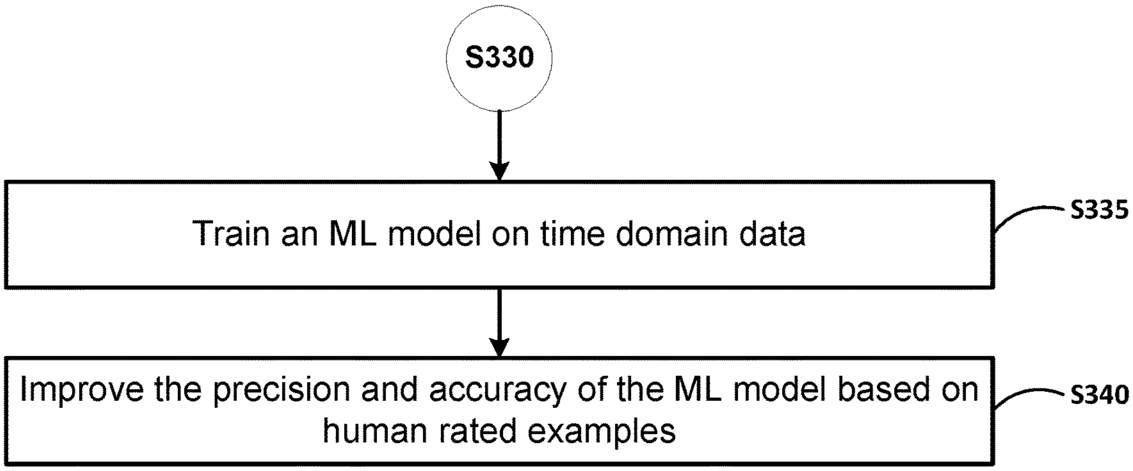
FIG. 3C illustrates a block diagram of yet another method of determining audio dissonance according to at least one example embodiment.

FIG. 3C illustrates a block diagram of yet another method of determining audio dissonance according to at least one example embodiment. FIG. 3C can include using supervised and/or unsupervised learning to train a machine learned (ML) model based on dissonance. As shown in FIG. 3C, in step S335 a ML model is trained (e.g., using unsupervised learning) on time domain data. For example, the ML model (e.g., the dissonance modelling 210) can be trained based on dissonance (e.g., a dissonance frequency, level and/or range) and/or frequencies associated with the level (e.g., intensity, power, pressure) causing the dissonance.

In an example implementation, an audio stream can be selected and encoded using an initial quantization parameter setting. Then the encoded audio stream can be decoded and dissonance for the decoded audio stream can be calculated (as described above). The dissonance for the original selected audio stream can also be calculated and compared to the dissonance of the decoded audio stream. The results of the comparison can be tested (e.g., using a loss function). In response to passing some criterion (e.g., a minimal loss of dissonance), the dissonance model can be saved. In response to failing some criterion (e.g., a above a threshold loss of dissonance), the dissonance model can be updated. The updated dissonance model can be used to select a new quantization parameter setting and the training process can be repeated until the results of the dissonance test pass the criterion. The ML training process can be repeated using a plurality of audio streams. In an example implementation, the dissonance model can be trained using deep learning techniques (e.g., Convolutional Neural Networks (CNNs)) in an unsupervised algorithm.

In step S340 the precision and accuracy of the ML model is improved (e.g., using supervised learning) based on human rated examples. For example, the ML model (e.g., the dissonance modelling 210) can be trained based on a user's rating of a decoded audio stream. In an example implementation, the ML model can be trained (or improved) using at least one of a supervised learning algorithm and an unsupervised algorithm meaning that the ML model can be trained (or improved) using a supervised learning algorithm, or an unsupervised algorithm, or both a supervised learning algorithm and an unsupervised algorithm.

In an example implementation, an audio stream can be selected and encoded using an initial quantization parameter setting. Then the encoded audio stream can be decoded and dissonance for the decoded audio stream can be rated based on a user's experience when listening to the decoded audio stream. The dissonance for the original selected audio stream can be also rated based on a user's experience when listening to the decoded audio stream. The results of the comparison can be tested (e.g., using a loss function). In response to passing some criterion (e.g., a minimal loss of dissonance), the dissonance model can be saved. In response to failing some criterion (e.g., a above a threshold loss of dissonance), the dissonance model can be updated. The updated dissonance model can be used to select a new quantization parameter setting and the training process can be repeated until the results of the dissonance test pass the criterion. The ML training process can be repeated using a plurality of audio streams. In an example implementation, the dissonance model can be trained using deep learning techniques (e.g., Convolutional Neural Networks (CNNs)) in an unsupervised algorithm.

Figure 4A:
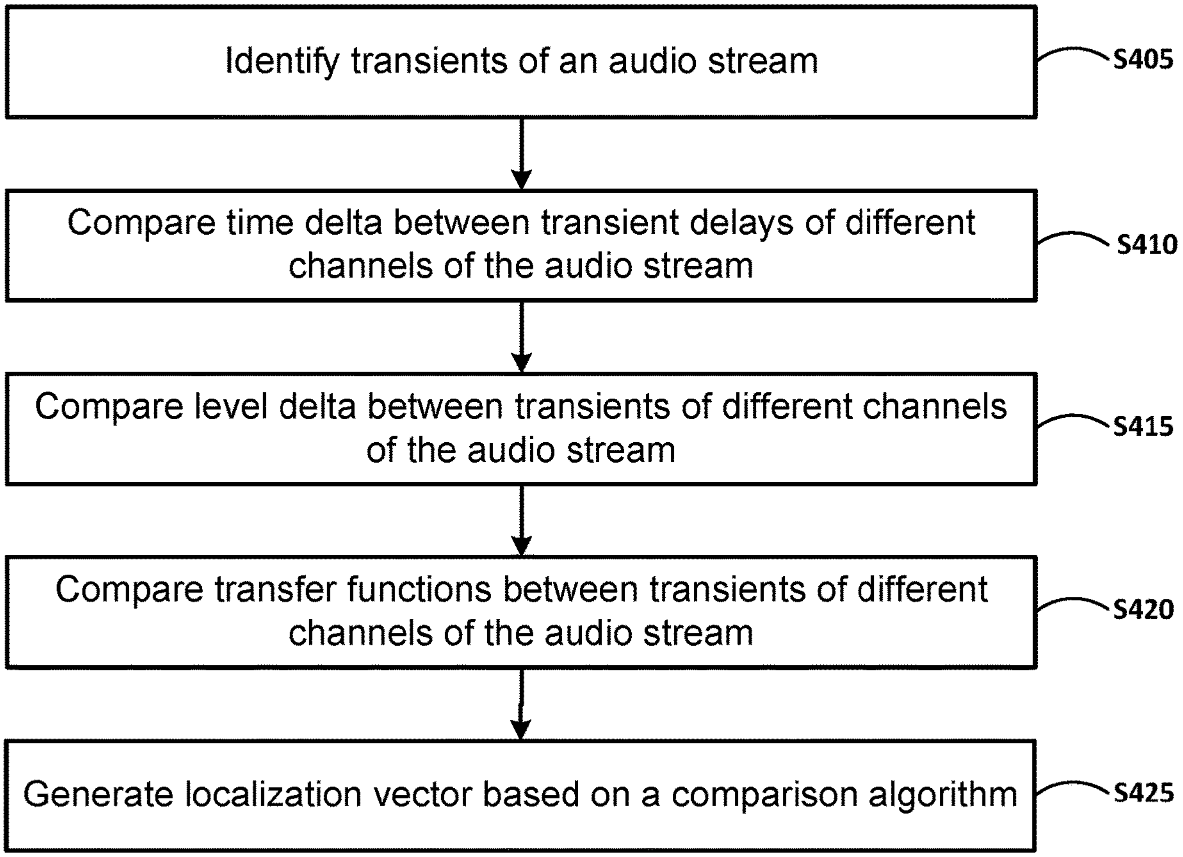
FIG. 4A illustrates a block diagram of a method of determining audio localization according to at least one example embodiment.
Figure 5A:
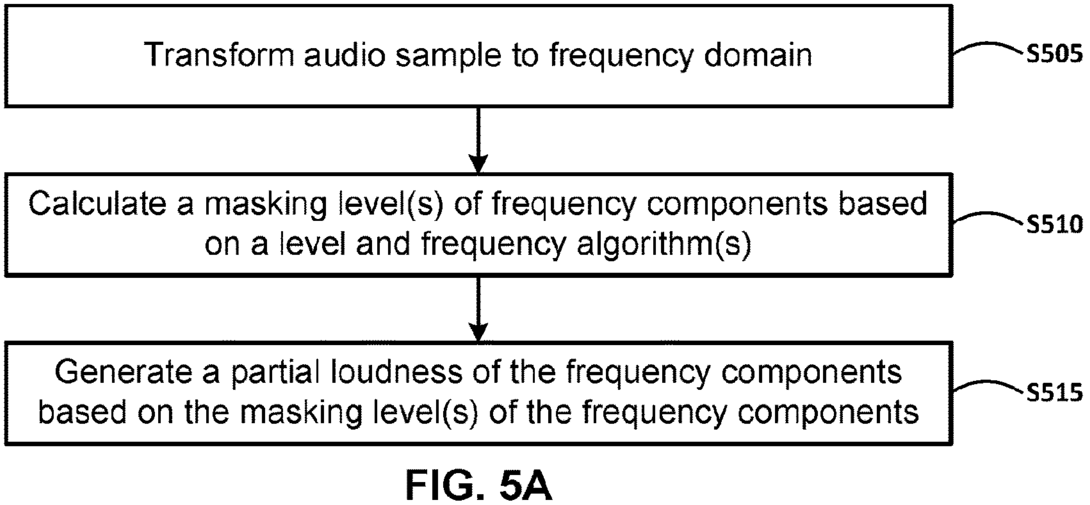
FIG. 5A illustrates a block diagram of a method of determining audio salience according to at least one example embodiment.

Using a dissonance model to revise or update quantization parameters can be a tool used to minimize the reduction of the artistic expression when compressing/decompressing an audio stream. Another tool used to minimize the reduction of the artistic expression when compressing/decompressing an audio stream can be using localization (alone or together with the dissonance model) to revise or update quantization parameters. FIG. 4A illustrates a block diagram of a method of determining audio localization according to at least one example embodiment. As shown in FIG. 4A, in step S405 transients of an audio stream are identified. For example, an audio stream (e.g., audio input 5), or a portion thereof, can include a plurality of audio transients. An audio transient can be detected based on a variation in a time domain energy function. Transient detection algorithms based on this definition, chose an energy-based criterion to detect transients in the signal. The transients can be changes in energy from a low value to a high value (indicating initiation of a sound). Identifying the transients can include identifying the time (e.g., in a timeline of the audio stream) at which the transient occurs.

In step S410 a time delta between transient delays of different channels of the audio stream is compared. For example, the audio stream can be divided into frequency sub-bands (e.g., equal-width frequency sub-bands). The frequency sub-bands can be within a range that is audible to humans. In an example implementation, the transient delays can be the time delta between the same two transients in different (e.g., left or right) channels (or instrument (e.g., microphone) channel 1, 2, . . . N) can be compared. For example, the time deltas can define a distance difference between the channels.

In step S415 a level delta between transients of different channels of the audio stream is compared. For example, level (e.g., intensity, power, pressure and/or the like) can be determined for each of the identified transients. Then the level deltas associated with transients in each channel can be determined. In an example implementation, the level delta between the same two transients in (e.g., left or right) channels (or instrument (e.g., microphone) channel 1, 2, . . . N) can be compared.

In step S420 a transfer function(s) between transients of different channels of the audio stream is compared. For example, a transfer function can be the impulse response and frequency response of a linear and time invariant (LTI) system. The audio stream can be an LTI system. Therefore, a Z-transform, discrete-time Fourier transform (DTFT), fast Fourier transform (FFT) can be applied to each of the identified transients in a channel and/or transient of different channels and the results can be compared.

In step S425 a localization vector is generated based on a comparison algorithm. Sound localization is the process of determining the location of a sound source. The localization vector can be $A_kL(k,t)$, where k and t indicate frequency and time-frame of the transients L is the level spectrum and $A_k$ is the transfer function matrix. Therefore, the localization function can be based on the time delta comparisons, the level delta comparisons and the transfer function comparisons.

Figure 4B:
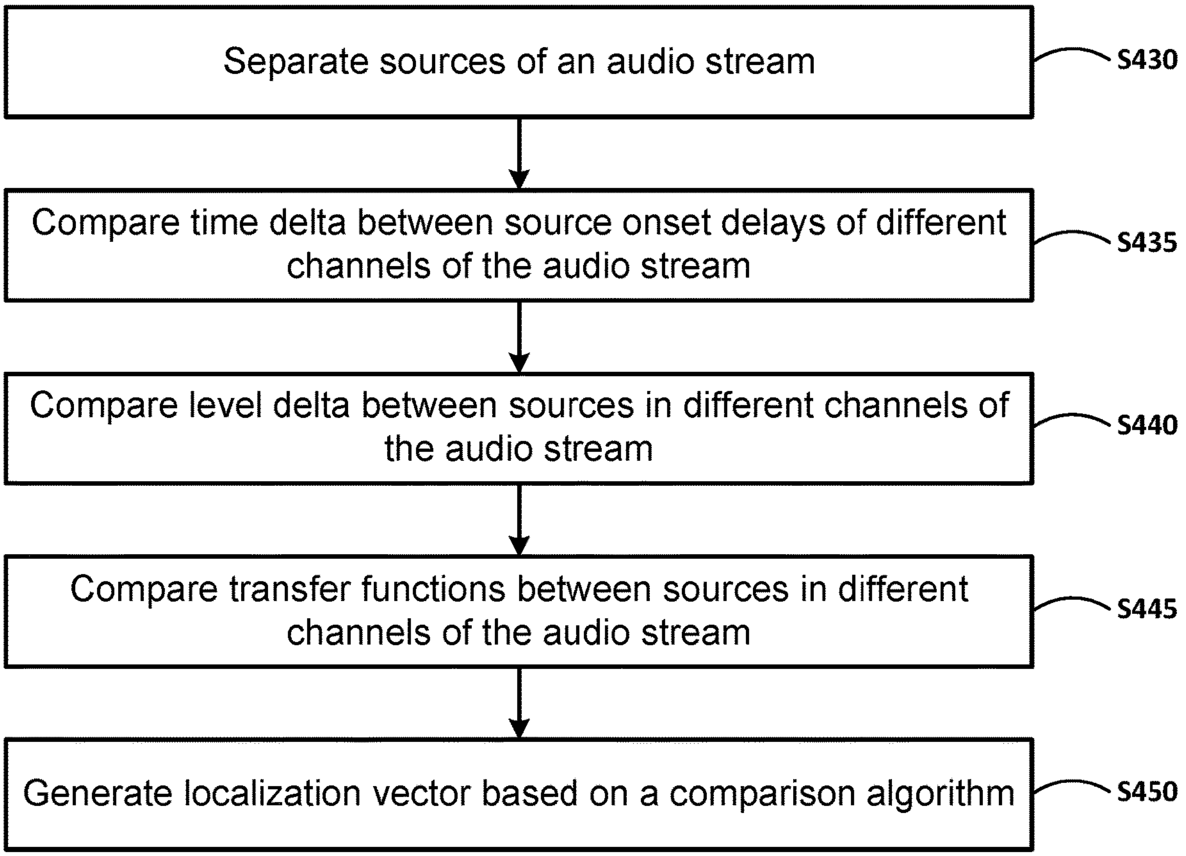
FIG. 4B illustrates a block diagram of another method of determining audio localization according to at least one example embodiment.

FIG. 4B illustrates a block diagram of another method of determining audio localization according to at least one example embodiment. As shown in FIG. 4B, in step S430 sources of an audio stream are separated. For example, an audio stream (e.g., audio input 5), or a portion thereof, can include a plurality of audio sources (e.g., instruments, people talking, environmental noise, and/or the like). The audio stream can be divided into left channels and/or right channels based on the source. The frequency sub-bands can be within a range that is audible to humans.

In some implementations, non-negative matrix factorization (NMF) can be used to identify the sources and/or frequency of the sources. NMF can be a matrix factorization method where the matrices are constrained to be non-negative. For example, a matrix X can be factored into two matrices W and H so that $X \approx WH$. X can be composed of m rows $x_1, x_2, \ldots, x_m$, W can be composed of k rows $w_1, w_2, \ldots, w_k$, H can be composed of m rows $h_1$, $h_2$, $h_m$. In an example implementation, each row in X can be considered a source and column can represent a feature (e.g., a frequency, a level, and/or the like) of the source. Further, each row in H can be a component, and each row in W can contain the weights of each component. NMF can be applied to the audio stream using, for example, a trained ML model. Each source (e.g., $x_1$, $x_2$, $x_m$) can be separated (e.g., filtered) from the audio stream based on a corresponding feature (e.g., frequency).

In some implementations, the frequency sub-bands can be determined based on frequency continuity, transitions, harmony, musical sources (e.g., voice, guitar, drum, and/or the like). A trained ML model can be used to identify sources. For example, a source can have a single frequency (e.g., machinery sound constantly repeating, wind blowing, and/or the like). Sometimes these single frequency sources can be background noise. The frequency of the single frequency sources can be separated (e.g., filtered) from the audio stream). Musical sources can be carried in channels (e.g., frequency sub-bands (e.g., equal-width frequency sub-bands)). The channels can be separated (e.g., filtered) from the audio stream. Some sources can have repetitive (constant frequency) impulses (e.g., a jack hammer). The frequency of the repetitive impulse sources can be separated (e.g., filtered) from the audio stream). Some sources can harmonious tones (e.g., a bird singing). The frequency of the harmonious tone sources can be separated (e.g., filtered) from the audio stream). The above sources are example sources, other sources are within the scope of this disclosure.

In step S435 a time delta between source onset delays of different channels of the audio stream is compared. For example, the audio stream can be divided into left channel and/or right channel for each source. The frequency of the channels (e.g., left and/or right) can be within a range that is audible to humans. In an example implementation, the source onset delays can be the time delta between the same source in different (e.g., left and right) channels.

In step S440 a level delta between transients of different channels of the audio stream is compared. For example, level (e.g., intensity, power, pressure and/or the like) can be determined for each of the identified transients. Then the level deltas associated with transients in each channel (e.g., left and right) can be determined. In an example implementation, the level delta between the same two transients in different channels (e.g., left and right) can be compared.

In step S445 a transfer function(s) between transients of different channels of the audio stream is compared. For example, a transfer function can be the impulse response and frequency response of a linear and time invariant (LTI) system. The audio stream can be an LTI system. Therefore, a Z-transform, discrete-time Fourier transform (DTFT), fast Fourier transform (FFT) can be applied to each of the identified transients in a channel and/or transient of different channels and the results can be compared.

In step S450 a localization vector is generated based on a comparison algorithm. Sound localization is the process of determining the location of a sound source. The localization vector can be $A_k L(k,t)$, where k and t indicate frequency and time-frame of the transients L is the level spectrum and $A_k$ is the transfer function matrix. Therefore, the localization function can be based on the time delta comparisons, the level delta comparisons and the transfer function comparisons.

Figure 4C:
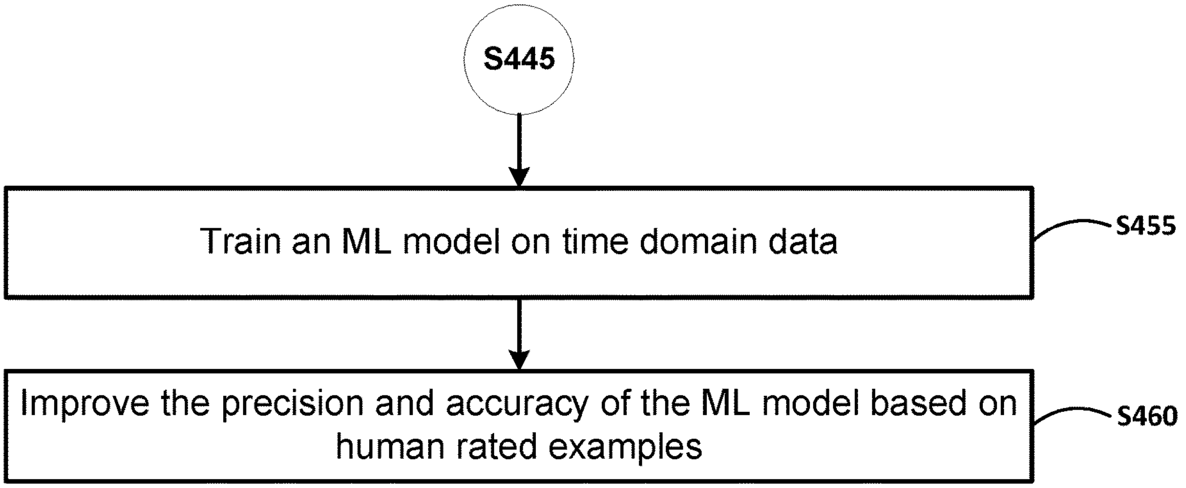
FIG. 4C illustrates a block diagram of yet another method of determining audio localization according to at least one example embodiment.

As shown in FIG. 4C, in step S455 a ML model is trained (e.g., using unsupervised learning) on time domain data. For example, the ML model (e.g., the localization modelling 215) can be trained based on localization and/or frequencies or levels associated with the localization. In an example implementation, the ML model can be trained (or improved) using at least one of a supervised learning algorithm and an unsupervised algorithm meaning that the ML model can be trained (or improved) using a supervised learning algorithm, or an unsupervised algorithm, or both a supervised learning algorithm and an unsupervised algorithm.

In an example implementation, an audio stream can be selected and encoded using an initial quantization parameter setting. Then the encoded audio stream can be decoded and localization for the decoded audio stream can be calculated (as described above). The localization for the original selected audio stream can also be calculated and compared to the localization of the decoded audio stream. The results of the comparison can be tested (e.g., using a loss function). In response to passing some criterion (e.g., a minimal loss of localization), the localization model can be saved. In response to failing some criterion (e.g., a above a threshold loss of localization), the localization model can be updated. The updated localization model can be used to select a new quantization parameter setting and the training process can be repeated until the results of the localization test pass the criterion. The ML training process can be repeated using a plurality of audio streams. In an example implementation, the localization model can be trained using deep learning techniques (e.g., Convolutional Neural Networks (CNNs)) in an unsupervised algorithm.

In step S460 the precision and accuracy of the ML model is improved (e.g., using supervised learning) based on human rated examples. For example, the ML model (e.g., the localization modelling 215) can be trained based on a user's rating of a decoded audio stream. In an example implementation, the ML model can be trained (or improved) using at least one of a supervised learning algorithm and an unsupervised algorithm meaning that the ML model can be trained (or improved) using a supervised learning algorithm, or an unsupervised algorithm, or both a supervised learning algorithm and an unsupervised algorithm.

In an example implementation, an audio stream can be selected and encoded using an initial quantization parameter setting. Then the encoded audio stream can be decoded and localization for the decoded audio stream can be rated based on a user's experience when listening to the decoded audio stream. The localization for the original selected audio stream can be also rated based on a user's experience when listening to the decoded audio stream. The results of the comparison can be tested (e.g., using a loss function). In response to passing some criterion (e.g., a minimal loss of localization), the localization model can be saved. In response to failing some criterion (e.g., a above a threshold loss of localization), the localization model can be updated. The updated localization model can be used to select a new quantization parameter setting and the training process can be repeated until the results of the localization test pass the criterion. The ML training process can be repeated using a plurality of audio streams. In an example implementation, the localization model can be trained using deep learning techniques (e.g., Convolutional Neural Networks (CNNs)) in an unsupervised algorithm.

Using a dissonance model and/or a localization model to revise or update quantization parameters can be a tool used to minimize the reduction of the artistic expression when compressing/decompressing an audio stream. Another tool used to minimize the reduction of the artistic expression when compressing/decompressing an audio stream can be using audio salience (alone or together with the dissonance model and/or the localization model) to revise or update quantization parameters. FIG. 5A illustrates a block diagram of a method of determining audio salience according to at least one example embodiment. Audio salience can be used to predict the perceptibility, or salience (noticeability, importance or prominence) of the differences in dissonance or localization cues.

As shown in FIG. 5A, in step S505 an audio sample is transformed to the frequency domain. For example, an audio stream (e.g., audio input 5), or a portion thereof, can be transformed to the frequency domain. The transform can be a digital Fourier transform (DFT), a fast Fourier transform (FFT), a discrete cosine transform (DCT), adaptive DCT (ADCT), and/or the like.

In step S510 a masking level(s) of frequency components is calculated based on a level and frequency algorithm(s). In audio signals, masking can be where a first sound is affected by a second sound. Therefore, calculating masking level(s) of frequency components can include determining a frequency of the component (e.g., channel) and a level (e.g., intensity, power, pressure and/or the like) at the frequency. Calculating the masking level can include determining a level (e.g., intensity, power, pressure and/or the like) to mask or interfere with the signal at the frequency. For example, calculating the masking level can include calculating a level that will cause the signal level to correspond to an imperceptible sound. However, in example implementations, salience can relate to partial loudness. Partial loudness can refer to the actual perceived loudness of a sound against a background of other sounds. Therefore, calculating the masking level can include calculating a partial mask. Partial masking can be generating a sound that influences the perception of a given sound even though the sound is still audible.

In step S515 a partial loudness of the frequency components is generated based on the masking level(s) of the frequency components. For example, the partial mask can be applied to the frequency components and a loudness can be determined for the frequency components. Loudness can be measured in phons (or sones). Loudness can be related to the perceptual measure of the effect of energy on the human ear. Loudness can be frequency dependent. In an example implementation, the salience can be the perceived loudness at a frequency after masking the signal at the frequency.

Figure 5B:
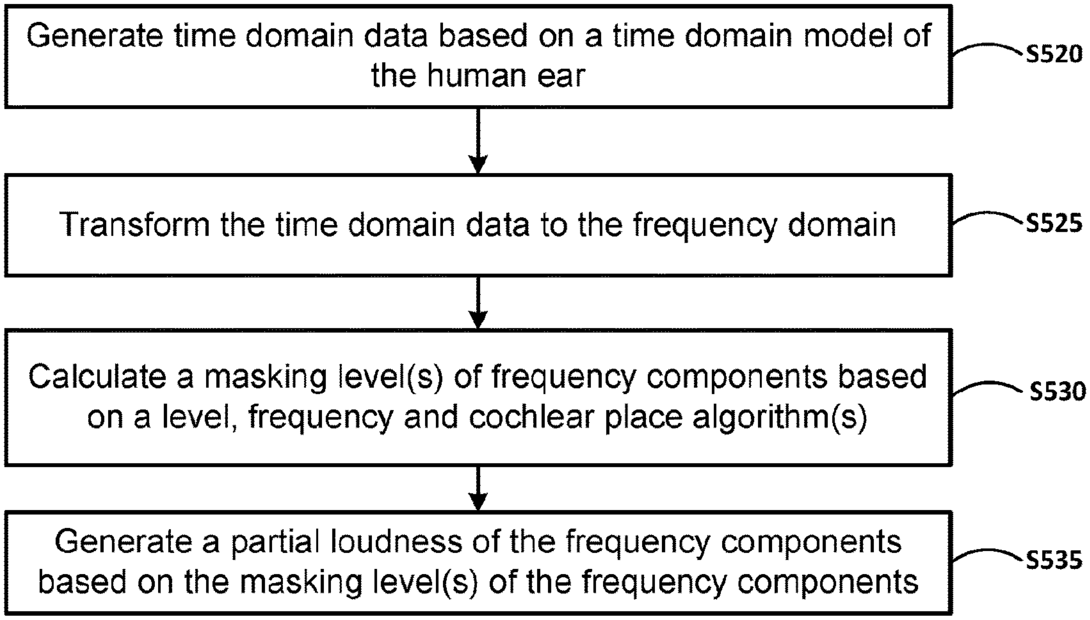
FIG. 5B illustrates a block diagram of another method of determining audio salience according to at least one example embodiment.
Figure 6:
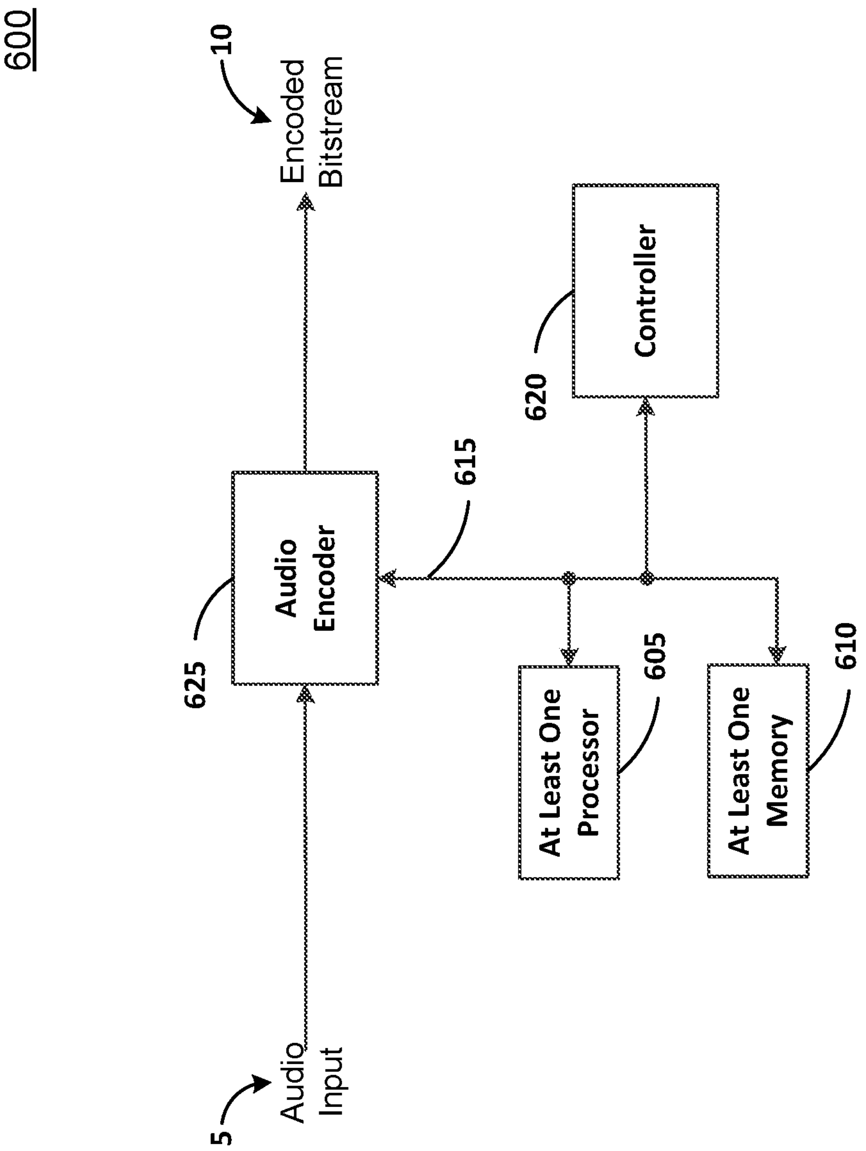
FIG. 6 illustrates a block diagram of an apparatus according to at least one example embodiment.

FIG. 5B illustrates a block diagram of another method of determining audio salience according to at least one example embodiment. As shown in FIG. 5B, in step S520 time domain data is generated based on a time domain model of the human ear. For example, the time domain model can be configured to predict the response of the cochlea (inner ear of a human) to the audio stream. The time domain model can include mono and stereo modelling.

In step S525 the time domain data is transformed to the frequency domain. For example, an audio stream (e.g., audio input 5), or a portion thereof, can be transformed to the frequency domain. The transform can be a digital Fourier transform (DFT), a fast Fourier transform (FFT), a discrete cosine transform (DCT), adaptive DCT (ADCT), and/or the like.

In step S530 a masking level(s) of frequency components is calculated based on a level, frequency and cochlear place algorithm(s). In audio signals, masking can be where a first sound is affected by a second sound. Therefore, calculating masking level(s) of frequency components can include determining a frequency of the component (e.g., channel) and a level (e.g., intensity, power, pressure and/or the like) at the frequency. A cochlear place can be a correlation between a stimulus location on the cochlear (human inner ear) and a frequency, a frequency range, a combination of frequencies, and/or the like. Calculating the masking level can include determining a level (e.g., intensity, power, pressure and/or the like) to mask or interfere with the signal at a frequency that may stimulate a cochlear place. In example implementations, salience can relate to partial loudness. Partial loudness can refer to the actual perceived loudness of a sound at a cochlear place against a background of other sounds. Therefore, calculating the masking level can include calculating a partial mask. Partial masking can be generating a sound that influences the perception of a given sound even though the sound is still audible.

In step S535 a partial loudness of the frequency components is generated based on the masking level(s) of the frequency components. For example, the partial mask can be applied to the frequency components and a loudness can be determined for the frequency components. Loudness can be measured in phons (or sones). Loudness can be related to the perceptual measure of the effect of energy on the human ear. Loudness can be frequency dependent. In an example implementation, the salience can be the perceived loudness at a frequency after masking the signal at the frequency.

Figure 5C:
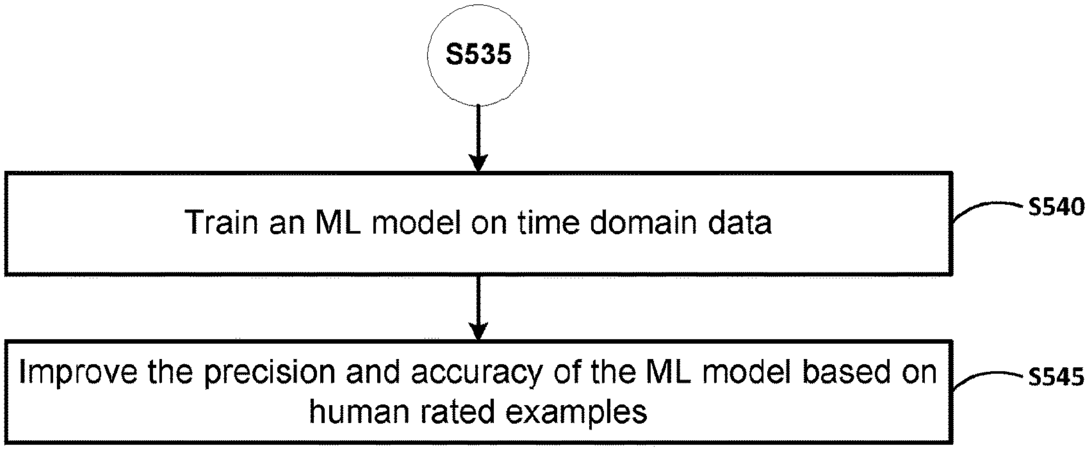
FIG. 5C illustrates a block diagram of yet another method of determining audio salience according to at least one example embodiment.

FIG. 5C illustrates a block diagram of yet another method of determining audio salience according to at least one example embodiment. As shown in FIG. 5C, in step S540 an ML model is trained on time domain data. For example, the ML model (e.g., the salience modelling 220) can be trained based on salience and/or frequencies or levels associated with the salience.

In an example implementation, an audio stream can be selected and encoded using an initial quantization parameter setting. Then the encoded audio stream can be decoded and audio salience for the decoded audio stream can be calculated (as described above). The audio salience for the original selected audio stream can also be calculated and compared to the audio salience of the decoded audio stream. The results of the comparison can be tested (e.g., using a loss function). In response to passing some criterion (e.g., a minimal loss of audio salience), the salience model can be saved. In response to failing some criterion (e.g., a above a threshold loss of audio salience), the salience model can be updated. The updated salience model can be used to select a new quantization parameter setting and the training process can be repeated until the results of the audio salience test pass the criterion. The ML training process can be repeated using a plurality of audio streams. In an example implementation, the salience model can be trained using deep learning techniques (e.g., Convolutional Neural Networks (CNNs)) in an unsupervised algorithm.

In step S545 the precision and accuracy of the ML model is improved (e.g., using supervised learning) based on human rated examples. For example, the ML model (e.g., the salience modelling 220) can be trained based on a user's rating of a decoded audio stream. In an example implementation, the ML model can be trained (or improved) using at least one of a supervised learning algorithm and an unsupervised algorithm meaning that the ML model can be trained (or improved) using a supervised learning algorithm, or an unsupervised algorithm, or both a supervised learning algorithm and an unsupervised algorithm.

In an example implementation, an audio stream can be selected and encoded using an initial quantization parameter setting. Then the encoded audio stream can be decoded and audio salience for the decoded audio stream can be rated based on a user's experience when listening to the decoded audio stream. The audio salience for the original selected audio stream can be also rated based on a user's experience when listening to the decoded audio stream. The results of the comparison can be tested (e.g., using a loss function). In response to passing some criterion (e.g., a minimal loss of localization), the salience model can be saved. In response to failing some criterion (e.g., a above a threshold loss of audio salience), the salience model can be updated. The updated salience model can be used to select a new quantization parameter setting and the training process can be repeated until the results of the audio salience test pass the criterion. The ML training process can be repeated using a plurality of audio streams. In an example implementation, the salience model can be trained using deep learning techniques (e.g., Convolutional Neural Networks (CNNs)) in an unsupervised algorithm.

FIG. 6 illustrates a block diagram of an audio encoding apparatus according to at least one example embodiment. As shown in FIG. 6, the block diagram of an audio encoding apparatus 600 includes at least one processor 605, at least one memory 610, controller 620, and audio encoder 625. The at least one processor 605, the at least one memory 610, the controller 620, and the audio encoder 625 are communicatively coupled via bus 615.

In the example of FIG. 6, the audio encoding apparatus 600 may be at least one computing device and should be understood to represent virtually any computing device configured to perform the techniques described herein. As such, the audio encoding apparatus 600 may be understood to include various components which may be utilized to implement the techniques described herein, or different or future versions thereof. For example, the audio encoding apparatus 600 is illustrated as including at least one processor 605, as well as at least one memory 610 (e.g., a computer readable storage medium).

Therefore, the at least one processor 605 may be utilized to execute instructions stored on the at least one memory 610. As such, the at least one processor 605 can implement the various features and functions described herein, or additional or alternative features and functions (e.g., an audio encoder with quantization parameter revision). The at least one processor 605 and the at least one memory 610 may be utilized for various other purposes. For example, the at least one memory 610 may be understood to represent an example of various types of memory and related hardware and software which can be used to implement any one of the modules described herein. According to example implementations, the audio encoding apparatus 600 may be included in larger system (e.g., a personal computer, a laptop computer, a mobile device and/or the like).

The at least one memory 610 may be configured to store data and/or information associated with the audio encoder 625 and/or the audio encoding apparatus 600. The at least one memory 610 may be a shared resource. For example, the audio encoding apparatus 600 may be an element of a larger system (e.g., a personal computer, a mobile device, and the like). Therefore, the at least one memory 610 may be configured to store data and/or information associated with other elements (e.g., web browsing or wireless communication) within the larger system (e.g., an audio encoder with quantization parameter revision).

The controller 620 may be configured to generate various control signals and communicate the control signals to various blocks in the audio encoder 625 and/or the audio encoding apparatus 600. The controller 620 may be configured to generate the control signals in order to implement the quantization parameter revision techniques described herein.

The at least one processor 605 may be configured to execute computer instructions associated with the audio encoder 625, and/or the controller 620. The at least one processor 605 may be a shared resource. For example, the audio encoder apparatus 600 may be an element of a larger system (e.g., a personal computer, a mobile device, and the like). Therefore, the at least one processor 605 may be configured to execute computer instructions associated with other elements (e.g., web browsing or wireless communication) within the larger system.

Figure 7:
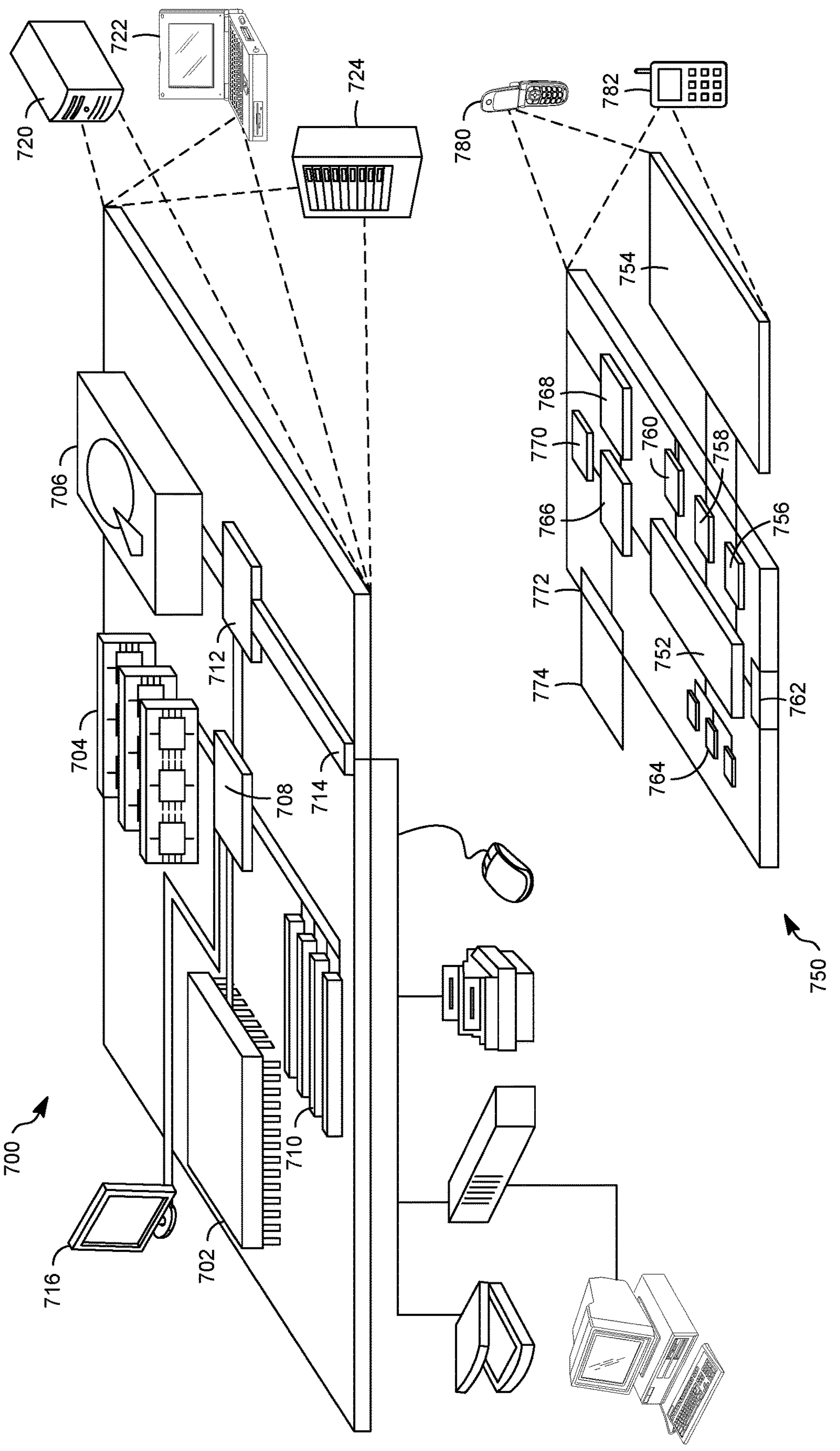
FIG. 7 shows an example of a computer device and a mobile computer device according to at least one example embodiment.

FIG. 7 shows an example of a computer device 700 and a mobile computer device 750, which may be used with the techniques described here. Computing device 700 is intended to represent various forms of digital computers, such as laptops, desktops, workstations, personal digital assistants, servers, blade servers, mainframes, and other appropriate computers. Computing device 750 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 700 includes a processor 702, memory 704, a storage device 706, a high-speed interface 708 connecting to memory 704 and high-speed expansion ports 710, and a low speed interface 712 connecting to low speed bus 714 and storage device 706. Each of the components 702, 704, 706, 708, 710, and 712, are interconnected using various busses, and may be mounted on a common motherboard or in other manners as appropriate. The processor 702 can process instructions for execution within the computing device 700, including instructions stored in the memory 704 or on the storage device 706 to display graphical information for a GUI on an external input/output device, such as display 716 coupled to high speed interface 708. In other implementations, multiple processors and/or multiple buses may be used, as appropriate, along with multiple memories and types of memory. Also, multiple computing devices 700 may be connected, with each device providing portions of the necessary operations (e.g., as a server bank, a group of blade servers, or a multi-processor system).

The memory 704 stores information within the computing device 700. In one implementation, the memory 704 is a volatile memory unit or units. In another implementation, the memory 704 is a non-volatile memory unit or units. The memory 704 may also be another form of computer-readable medium, such as a magnetic or optical disk.

The storage device 706 is capable of providing mass storage for the computing device 700. In one implementation, the storage device 706 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 704, the storage device 706, or memory on processor 702.

The high-speed controller 708 manages bandwidth-intensive operations for the computing device 700, while the low speed controller 712 manages lower bandwidth-intensive operations. Such allocation of functions is exemplary only. In one implementation, the high-speed controller 708 is coupled to memory 704, display 716 (e.g., through a graphics processor or accelerator), and to high-speed expansion ports 710, which may accept various expansion cards (not shown). In the implementation, low-speed controller 712 is coupled to storage device 706 and low-speed expansion port 714. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 700 may be implemented in a number of different forms, as shown in the figure. For example, it may be implemented as a standard server 720, or multiple times in a group of such servers. It may also be implemented as part of a rack server system 724. In addition, it may be implemented in a personal computer such as a laptop computer 722. Alternatively, components from computing device 700 may be combined with other components in a mobile device (not shown), such as device 750. Each of such devices may contain one or more of computing device 700, 750, and an entire system may be made up of multiple computing devices 700, 750 communicating with each other.

Computing device 750 includes a processor 752, memory 764, an input/output device such as a display 754, a communication interface 766, and a transceiver 768, among other components. The device 750 may also be provided with a storage device, such as a microdrive or other device, to provide additional storage. Each of the components 750, 752, 764, 754, 766, and 768, are interconnected using various buses, and several of the components may be mounted on a common motherboard or in other manners as appropriate.

The processor 752 can execute instructions within the computing device 750, including instructions stored in the memory 764. The processor may be implemented as a chipset of chips that include separate and multiple analog and digital processors. The processor may provide, for example, for coordination of the other components of the device 750, such as control of user interfaces, applications run by device 750, and wireless communication by device 750.

Processor 752 may communicate with a user through control interface 758 and display interface 756 coupled to a display 754. The display 754 may be, for example, a TFT LCD (Thin-Film-Transistor Liquid Crystal Display) or an OLED (Organic Light Emitting Diode) display, or other appropriate display technology. The display interface 756 may comprise appropriate circuitry for driving the display 754 to present graphical and other information to a user. The control interface 758 may receive commands from a user and convert them for submission to the processor 752. In addition, an external interface 762 may be provide in communication with processor 752, to enable near area communication of device 750 with other devices. External interface 762 may provide, for example, for wired communication in some implementations, or for wireless communication in other implementations, and multiple interfaces may also be used.

The memory 764 stores information within the computing device 750. The memory 764 can be implemented as one or more of a computer-readable medium or media, a volatile memory unit or units, or a non-volatile memory unit or units. Expansion memory 774 may also be provided and connected to device 750 through expansion interface 772, which may include, for example, a SIMM (Single In Line Memory Module) card interface. Such expansion memory 774 may provide extra storage space for device 750, or may also store applications or other information for device 750. Specifically, expansion memory 774 may include instructions to carry out or supplement the processes described above, and may include secure information also. Thus, for example, expansion memory 774 may be provide as a security module for device 750, and may be programmed with instructions that permit secure use of device 750. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 764, expansion memory 774, or memory on processor 752, that may be received, for example, over transceiver 768 or external interface 762.

Device 750 may communicate wirelessly through communication interface 766, which may include digital signal processing circuitry where necessary. Communication interface 766 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 768. In addition, short-range communication may occur, such as using a Bluetooth, Wi-Fi, or other such transceiver (not shown). In addition, GPS (Global Positioning System) receiver module 770 may provide additional navigation- and location-related wireless data to device 750, which may be used as appropriate by applications running on device 750.

Device 750 may also communicate audibly using audio codec 760, which may receive spoken information from a user and convert it to usable digital information. Audio codec 760 may likewise generate audible sound for a user, such as through a speaker, e.g., in a handset of device 750. Such sound may include sound from voice telephone calls, may include recorded sound (e.g., voice messages, music files, etc.) and may also include sound generated by applications operating on device 750.

The computing device 750 may be implemented in a number of different forms, as shown in the figure. For example, it may be implemented as a cellular telephone 780. It may also be implemented as part of a smart phone 782, personal digital assistant, or other similar mobile device.

In a general aspect, a device, a system, a non-transitory computer-readable medium (having stored thereon computer executable program code which can be executed on a computer system), and/or a method can perform a process with a method including receiving a plurality of audio channels based on an audio stream, applying a model based on at least one acoustic perception algorithm to the plurality of audio channels to generate a first modelled audio stream, quantizing the plurality of audio channels using a first set of quantization parameters, dequantizing the quantized plurality of audio channels using the first set of quantization parameters, applying the model based on at least one acoustic perception algorithm to the dequantized plurality of audio channels to generate a second modelled audio stream, comparing the first modelled audio stream and the second modelled audio stream, in response to determining the comparison of the first modelled audio stream and the second modelled audio stream does not meet a criterion, generating a second set of quantization parameters, and quantizing the plurality of audio channels using the second set of quantization parameters.

In another general aspect, a device, a system, a non-transitory computer-readable medium (having stored thereon computer executable program code which can be executed on a computer system), and/or a method can perform a process with a method including receiving an audio stream, applying a model based on at least one acoustic perception algorithm to the audio stream to generate a first modelled audio stream, compressing the audio stream using a first set of quantization parameters, decompressing the compressed the audio stream using the first set of quantization parameters, applying the model based on at least one acoustic perception algorithm to the decompressed audio stream to generate a second modelled audio stream, comparing the first modelled audio stream and the second modelled audio stream, in response to determining the comparison of the first modelled audio stream and the second modelled audio stream does not meet a criterion, generating a second set of quantization parameters, and compressing the audio stream using the second set of quantization parameters.

Implementations can include one or more of the following features. For example, the model based on at least one acoustic perception algorithm can be a dissonance model. The model based on at least one acoustic perception algorithm can be a localization model. The model based on at least one acoustic perception algorithm can be a salience model. The model based on at least one acoustic perception algorithm can be a trained machine learning model trained using at least one of a supervised learning algorithm and an unsupervised learning algorithm meaning that the ML model can be trained (or improved) using (1) a supervised learning algorithm, or (2) an unsupervised algorithm, or both a supervised learning algorithm and an unsupervised algorithm meaning based on (1), (2), or (1) and (2).

The model based on at least one acoustic perception algorithm can be based on a frequency and a level algorithm applied to the audio channels in the frequency domain. The model based on at least one acoustic perception algorithm can be based on a calculation of a masking level between at least two frequency components. The model based on at least one acoustic perception algorithm can be based on at least one of (1) a time delta comparison, (2) a level delta comparison and (3) a transfer function applied to transients associated with a left audio channel and a right audio channel meaning based on (1), (2), (3), (1) and (2), (1) and (3), (2) and (3), or (1), (2), and (3). The model based on at least one acoustic perception algorithm can be based on (1) a frequency, (2) a level, and (3) a cochlear place algorithm applied to the audio channels in the frequency domain meaning based on (1), (2), (3), (1) and (2), (1) and (3), (2) and (3), or (1), (2), and (3).

While example embodiments may include various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Like numbers refer to like elements throughout the description of the figures.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. Various implementations of the systems and techniques described here can be realized as and/or generally be referred to herein as a circuit, a module, a block, or a system that can combine software and hardware aspects. For example, a module may include the functions/acts/computer program instructions executing on a processor (e.g., a processor formed on a silicon substrate, a GaAs substrate, and the like) or some other programmable data processing apparatus.

Some of the above example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed above, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

Specific structural and functional details disclosed herein are merely representative for purposes of describing example embodiments. Example embodiments, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term and/or includes any and all combinations of one or more of the associated listed items.

It will be understood that when an element is referred to as being connected or coupled to another element, it can be directly connected or coupled to the other element or intervening elements may be present. In contrast, when an element is referred to as being directly connected or directly coupled to another element, there are no intervening elements present. Other words used to describe the relationship between elements should be interpreted in a like fashion (e.g., between versus directly between, adjacent versus directly adjacent, etc.).

The terminology used herein is for the purpose of describing particular embodiments only and is not intended to be limiting of example embodiments. As used herein, the singular forms a, an and the are intended to include the plural forms as well, unless the context clearly indicates otherwise. It will be further understood that the terms comprises, comprising, includes and/or including, when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the above example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the above illustrative embodiments, reference to acts and symbolic representations of operations (e.g., in the form of flowcharts) that may be implemented as program modules or functional processes include routines, programs, objects, components, data structures, etc., that perform particular tasks or implement particular abstract data types and may be described and/or implemented using existing hardware at existing structural elements. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as processing or computing or calculating or determining of displaying or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the example embodiments are typically encoded on some form of non-transitory program storage medium or implemented over some type of transmission medium. The program storage medium may be magnetic (e.g., a floppy disk or a hard drive) or optical (e.g., a compact disk read only memory, or CD ROM), and may be read only or random access. Similarly, the transmission medium may be twisted wire pairs, coaxial cable, optical fiber, or some other suitable transmission medium known to the art. The example embodiments not limited by these aspects of any given implementation.

Lastly, it should also be noted that whilst the accompanying claims set out particular combinations of features described herein, the scope of the present disclosure is not limited to the particular combinations hereafter claimed, but instead extends to encompass any combination of features or embodiments herein disclosed irrespective of whether or not that particular combination has been specifically enumerated in the accompanying claims at this time.

What is claimed is:

1. A method comprising:
- receiving a plurality of audio channels based on an audio stream;
- applying a model based on at least one acoustic perception algorithm based on a frequency, a level, and a cochlear place algorithm applied to the plurality of audio channels in the frequency domain to generate a first modelled audio stream;
- quantizing the plurality of audio channels using a first set of quantization parameters;
- dequantizing the quantized plurality of audio channels using the first set of quantization parameters;
- applying the model based on at least one acoustic perception algorithm to the dequantized plurality of audio channels to generate a second modelled audio stream;
- determining a difference in perception by comparing the first modelled audio stream and the second modelled audio stream;
- in response to determining the difference does not meet a criterion, generating a second set of quantization parameters configured to reduce compression relative to the first set of quantization parameters to change a qualitative impact of quantization; and
- quantizing the plurality of audio channels using the second set of quantization parameters.

2. The method of claim 1, wherein the model based on at least one acoustic perception algorithm is a dissonance model.

3. The method of claim 1, wherein the model based on at least one acoustic perception algorithm is a localization model.

4. The method of claim 1, wherein the model based on at least one acoustic perception algorithm is a salience model.

5. The method of claim 1, wherein the model based on at least one acoustic perception algorithm is a trained machine learning model trained using at least one of a supervised learning algorithm and an unsupervised learning algorithm.

6. The method of claim 1, wherein the model based on at least one acoustic perception algorithm is based on a frequency and a level algorithm applied to the audio channels in the frequency domain.

7. The method of claim 1, wherein the model based on at least one acoustic perception algorithm is based on a calculation of a masking level between at least two frequency components.

8. The method of claim 1, wherein the model based on at least one acoustic perception algorithm is based on at least one of a time delta comparison, a level delta comparison and a transfer function applied to transients associated with a left audio channel and a right audio channel.

9. A method comprising:
- receiving an audio stream;
- applying a model based on at least one acoustic perception algorithm based on a frequency, a level, and a cochlear place algorithm applied to the plurality of audio channels in the frequency domain to generate a first modelled audio stream;
- compressing the audio stream using a first set of quantization parameters;
- decompressing the compressed audio stream using the first set of quantization parameters;
- applying the model based on at least one acoustic perception algorithm to the decompressed audio stream to generate a second modelled audio stream;
- determining a difference in perception by comparing the first modelled audio stream and the second modelled audio stream;
- in response to determining the difference does not meet a criterion, generating a second set of quantization parameters configured to reduce compression relative to the first set of quantization parameters to change a qualitative impact of quantization; and
- compressing the audio stream using the second set of quantization parameters.

10. The method of claim 9, wherein the model based on at least one acoustic perception algorithm is a dissonance model.

11. The method of claim 9, wherein the model based on at least one acoustic perception algorithm is a localization model.

12. The method of claim 9, wherein the model based on at least one acoustic perception algorithm is a salience model.

13. The method of claim 9, wherein the model based on at least one acoustic perception algorithm is a trained machine learning model trained using at least one of a supervised learning algorithm and an unsupervised learning algorithm.

14. The method of claim 9, wherein the model based on at least one acoustic perception algorithm is based on a frequency and a level algorithm applied to the audio channels in the frequency domain.

15. The method of claim 9, wherein the model based on at least one acoustic perception algorithm is based on a calculation of a masking level between at least two frequency components.

16. The method of claim 9, wherein the model based on at least one acoustic perception algorithm is based on at least one of a time delta comparison, a level delta comparison and a transfer function applied to transients associated with a left audio channel and a right audio.

17. An apparatus, comprising one or more processors, and a memory storing instructions which, when executed by the one or more processors, cause the one or more processors to:

receive a plurality of audio channels based on an audio stream;

apply a model based on at least one acoustic perception algorithm based on a frequency, a level, and a cochlear place algorithm applied to the plurality of audio channels in the frequency domain to generate a first modelled audio stream;

quantize the plurality of audio channels using a first set of quantization parameters;

dequantize the quantized plurality of audio channels using the first set of quantization parameters;

apply the model based on at least one acoustic perception algorithm to the dequantized plurality of audio channels to generate a second modelled audio stream;

determine a difference in perception by comparing the first modelled audio stream and the second modelled audio stream;

in response to determining the difference does not meet a criterion, generate a second set of quantization parameters configured to reduce compression relative to the first set of quantization parameters to change a qualitative impact of quantization; and quantize the plurality of audio channels using the second set of quantization parameters.

18. A non-transitory computer readable medium containing instructions that when executed cause a processor of a computer system to:

receive a plurality of audio channels based on an audio stream;

apply a model based on at least one acoustic perception algorithm based on a frequency, a level, and a cochlear place algorithm applied to the plurality of audio channels in the frequency domain to generate a first modelled audio stream;

quantize the plurality of audio channels using a first set of quantization parameters;

dequantize the quantized plurality of audio channels using the first set of quantization parameters;

apply the model based on at least one acoustic perception algorithm to the dequantized plurality of audio channels to generate a second modelled audio stream;

determine a difference in perception by comparing the first modelled audio stream and the second modelled audio stream;

in response to determining the difference does not meet a criterion, generate a second set of quantization parameters configured to reduce compression relative to the first set of quantization parameters to change a qualitative impact of quantization; and quantize the plurality of audio channels using the second set of quantization parameters.

* * * * *